United States Patent [19]
Jokura

[11] Patent Number: 5,541,929
[45] Date of Patent: Jul. 30, 1996

[54] TDMA MOBILE UNIT FREQUENCY SYNTHESIZER HAVING POWER SAVING MODE DURING TRANSMIT AND RECEIVE SLOTS

[75] Inventor: Jun Jokura, Tokyo, Japan

[73] Assignee: NEC Corporation, Tokyo, Japan

[21] Appl. No.: 378,868

[22] Filed: Jan. 24, 1995

Related U.S. Application Data

[63] Continuation of Ser. No. 46,194, Apr. 12, 1993, abandoned.

[30] Foreign Application Priority Data

| Apr. 10, 1992 | [JP] | Japan | 4-091172 |
| Apr. 30, 1992 | [JP] | Japan | 4-111492 |
| Apr. 30, 1992 | [JP] | Japan | 4-111541 |

[51] Int. Cl.⁶ .............................. H04B 1/40; H03L 7/18
[52] U.S. Cl. ................. 370/95.3; 370/100.1; 375/376; 455/343; 331/25
[58] Field of Search ................ 455/71, 77, 76, 455/75, 34.1, 31.1, 183.1, 183.2, 343, 127; 370/100.1, 105.3, 95.1, 105.2, 95.2, 95.3, 119; 375/376, 373, 371; 331/12, 1 A, 14, 16, 17, 25

[56] References Cited

U.S. PATENT DOCUMENTS

| 4,631,496 | 12/1986 | Borras et al. | 331/14 |
| 4,714,899 | 12/1987 | Kurtzman et al. | 331/1 A |
| 4,743,864 | 5/1988 | Nakagawa | 331/14 |
| 4,754,235 | 6/1988 | Fujiwara | 331/1 A |
| 4,893,094 | 1/1990 | Henold et al. | 331/1 A |
| 4,988,955 | 1/1991 | Horie | 331/11 |
| 5,126,693 | 6/1992 | Gulliver et al. | 331/25 |
| 5,140,698 | 8/1992 | Toko | 455/76 |
| 5,146,187 | 9/1992 | Vandegraaf | 331/17 |
| 5,180,992 | 1/1993 | Akiyama et al. | 331/11 |

FOREIGN PATENT DOCUMENTS

| 0272938 | 6/1988 | European Pat. Off. . |
| 0299674 | 1/1989 | European Pat. Off. . |
| 2183948 | 6/1987 | United Kingdom . |
| 8102371 | 8/1981 | WIPO . |

*Primary Examiner*—Melvin Marcelo
*Assistant Examiner*—Huy D. Vu
*Attorney, Agent, or Firm*—Sughrue, Mion, Zinn, Macpeak & Seas

[57] ABSTRACT

During transmit and receive slots of a TDMA frame, a reference pulse source (31) is made inactive for power savings purposes, and during an idle slot of the frame it is rendered active to supply pulses to a phase alignment circuit (32) where initial phase alignment is established between an output of a frequency divider (37) and the reference pulse. Phase-aligned signals are supplied to a phase comparator (33), the output of which is coupled to a switched filter bank (35) during the idle slot to cause a selected loop filter to develop a voltage according to the output of the phase comparator (33) to drive a voltage controlled oscillator (36) to generate a local carrier for allowing a channel switching to be effected for a possible hand-off. The connection between the phase comparator (33) and the filter bank (35) is cut off during the transmit and receive slots to maintain that voltage for a closed-loop operation during the next idle slot.

15 Claims, 11 Drawing Sheets

TDMA MOBILE UNIT FREQUENCY SYNTHESIZER HAVING POWER SAVING MODE DURING TRANSMIT AND RECEIVE SLOTS

This is a continuation of application Ser. No. 08/046,194 filed Apr. 12, 1993, now abandoned.

BACKGROUND OF THE INVENTION

1. Field of the Invention

The present Invention relates generally to cellular mobile communications systems, and more specifically to a power saving technique for a mobile unit frequency synthesizer for a TDMA (time division multiple access) cellular communication system.

2. Description of the Related Art

As illustrated In FIG. 1, a prior art frequency synthesizer for use in a TDMA cellular mobile communications system includes a direct digital synthesizer 10 that supplies reference pulses to an initial phase alignment circuit 11 to which the output of a frequency divider 16 is also applied to establish phase alignment with the reference pulse. The phase aligned signals are input to a phase comparator 12 where their phase difference is detected and fed via a switch 13 to a loop filter 14. A voltage-controlled oscillator 15 supplies a VCO output to the frequency divider 16 at a frequency variable with the output of the loop filter 14. A power-saving controlled DC voltage is supplied to the power-draining units of the frequency synthesizer such as DDS 10, phase comparator 12 and frequency divider 16 to periodically turn off their power supplies to reduce their energy consumption.

When the mobile unit is In a standby mode in a given cell, the power supply to the transmitter is permanently turned off and the power supply to the receiver is periodically turned on and off so as to enable it to monitor the control slot of the TDMA frame of the host cell site. The power-saving controlled voltage is synchronized with the power saving operation of the receiver. During a turn-off period, the switch 13 is turned off to operate the frequency synthesizer in an open-loop mode by feeding the VCO 15 with a voltage developed by the loop filter 14 during the previous turn-on period and currently maintained by the loop filter.

During a talking mode, the transmitter and receiver are alternately turned on during assigned transmit and receive slots of the TDMA frame and turned off during other time slots. The receiver is further turned on during an idle slot of the TDMA frame to enable channel switching to be performed in order to make a search for an adjacent channel in preparation for a possible hand-off.

Since the mobile unit is required to make a channel search and return to the current frame within a short period of time, the prior art mobile unit cannot turn off the power-draining parts of its frequency synthesizer at a high speed during talking modes. Therefore, the power saving feature of the synthesizer is used only during standby modes.

SUMMARY OF THE INVENTION

It is therefore an object of the present invention to provide a frequency synthesizer capable of power savings operation during a talking mode.

According to a first aspect of the present invention, there is provided a frequency synthesizer of a mobile unit for a time division multiple access (TDMA) cellular communication system, the system having a plurality of cell sites each being assigned a channel of unique frequency for carrying a TDMA frame having a sequence of receive and transmit slots and at least one idle slot. The frequency synthesizer comprises a reference pulse source for generating a train of reference pulses, and a phase comparator for generating a phase difference signal indicative of the phase difference between two input signals applied thereto. A switched filter bank is provided having loop filters of different cut-off frequencies, one of which is selected in response to a channel selection signal. A connection is established between the output of the phase comparator and the switched filter bank in response to a close-loop command signal to cause the selected loop filter to develop a voltage according to the phase difference signal and the connection is cut off in response to an open-loop command signal. A voltage-controlled oscillator is connected to the selected loop filter to generate a frequency output corresponding to the voltage developed by the selected loop filter. A frequency divider is connected to the VCO for producing an output at a frequency which is a submultiple of the frequency of the output from the VCO. A phase alignment circuit establishes initial phase alignment between the output of the frequency divider and the output of the reference pulse source in response to an enable signal and applying the phase-aligned signals to the phase comparator as the two input signals. A controller is provided for generating the open-loop command signal during the receive and transmit slots of the TDMA frame, and generating the close-loop command signal, the enable signal and the channel selection signal during the idle slot of the TDMA frame, and deactivating the reference pulse source during the receive and transmit slots and activating the reference pulse source during the idle slot.

According to a second aspect of the present invention, the frequency synthesizer includes a phase-lock detector connected to the phase comparator for producing a phase-lock detect signal when the phase difference indicates that the two input signals are locked in phase and means for generating a steady-state detect signal Indicating that the voltage developed in the loop filter has attained a substantially steady value. A gate circuit generates a signal when the phase-lock detect signal and the steady-state detect signal are simultaneously present. The controller supplies the channel selection signal to one of the reference pulse source and the frequency divider so that the output of the voltage-controlled oscillator is vaned according to the channel selection signal and responds to the signal from the gate circuit after the channel selection signal is generated for determining a transition from the close-loop command signal to the open-loop command signal.

According to a third aspect, the frequency synthesizer includes a delay circuit for delaying the output of the frequency divider for a predetermined interval, and a phase-lock detector connected to the phase comparator for producing a phase-lock detect signal when the phase difference indicates that the two input signals are locked in phase. A switch is provided for exclusively connecting the reference pulse to the phase alignment circuit in response to a first mode signal and exclusively connecting the output of the delay circuit to the phase alignment circuit in response to a second mode signal. The controller responds to a first phase-lock detect signal generated by the phase-lock detector in the presence of the first mode signal for determining a transition from the first mode signal to the second mode signal and responds to a second phase-lock detect signal generated by the phase-lock detector in the presence of the second mode signal for determining a transition from the active state to the Inactive state of the reference pulse source.

BRIEF DESCRIPTION OF THE DRAWINGS

The present invention will be described in further detail with reference to the accompanying drawings, in which.

DETAILED DESCRIPTION

Figure 1:
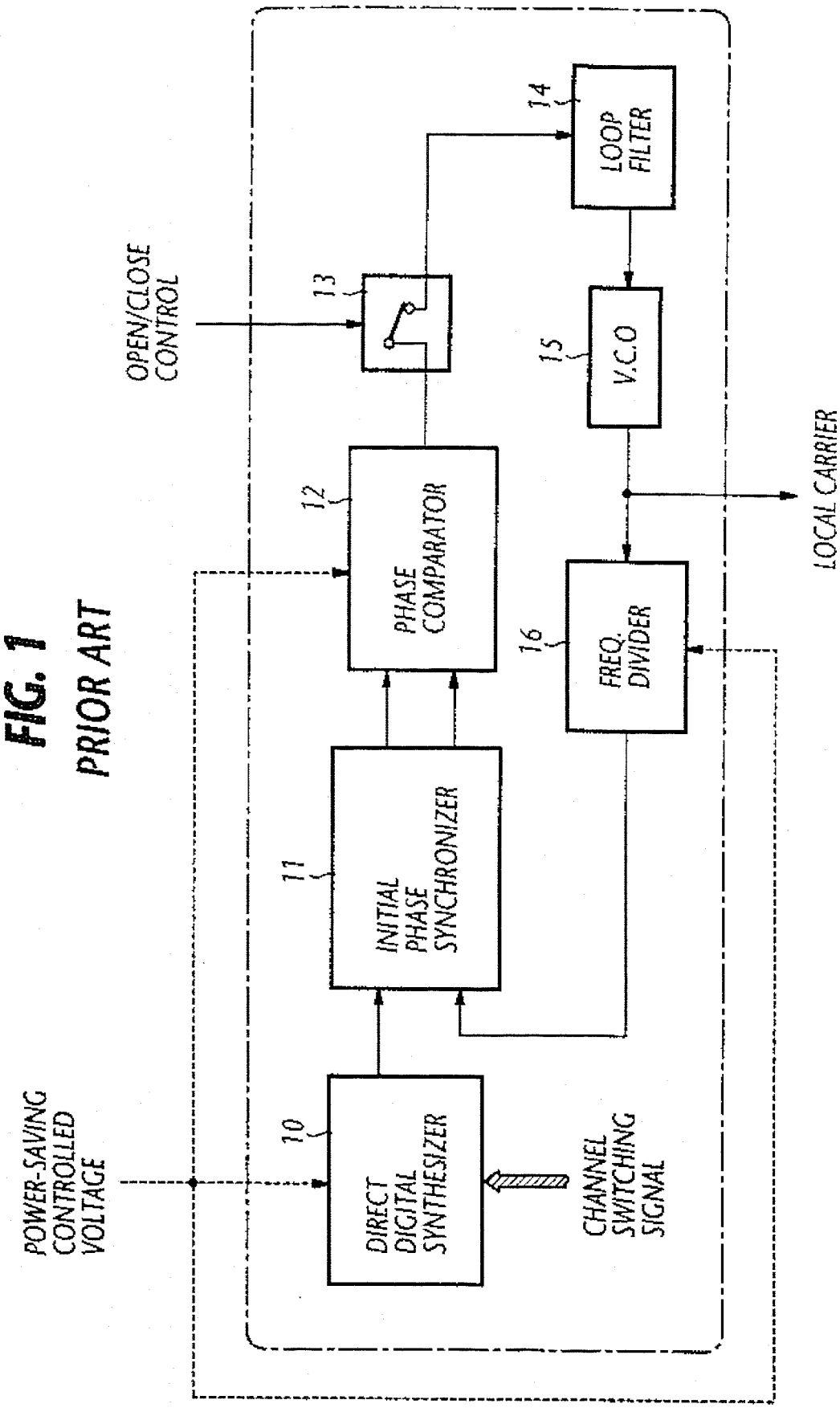
FIG. 1 is a block diagram of a prior art frequency synthesizer.
Figure 2:
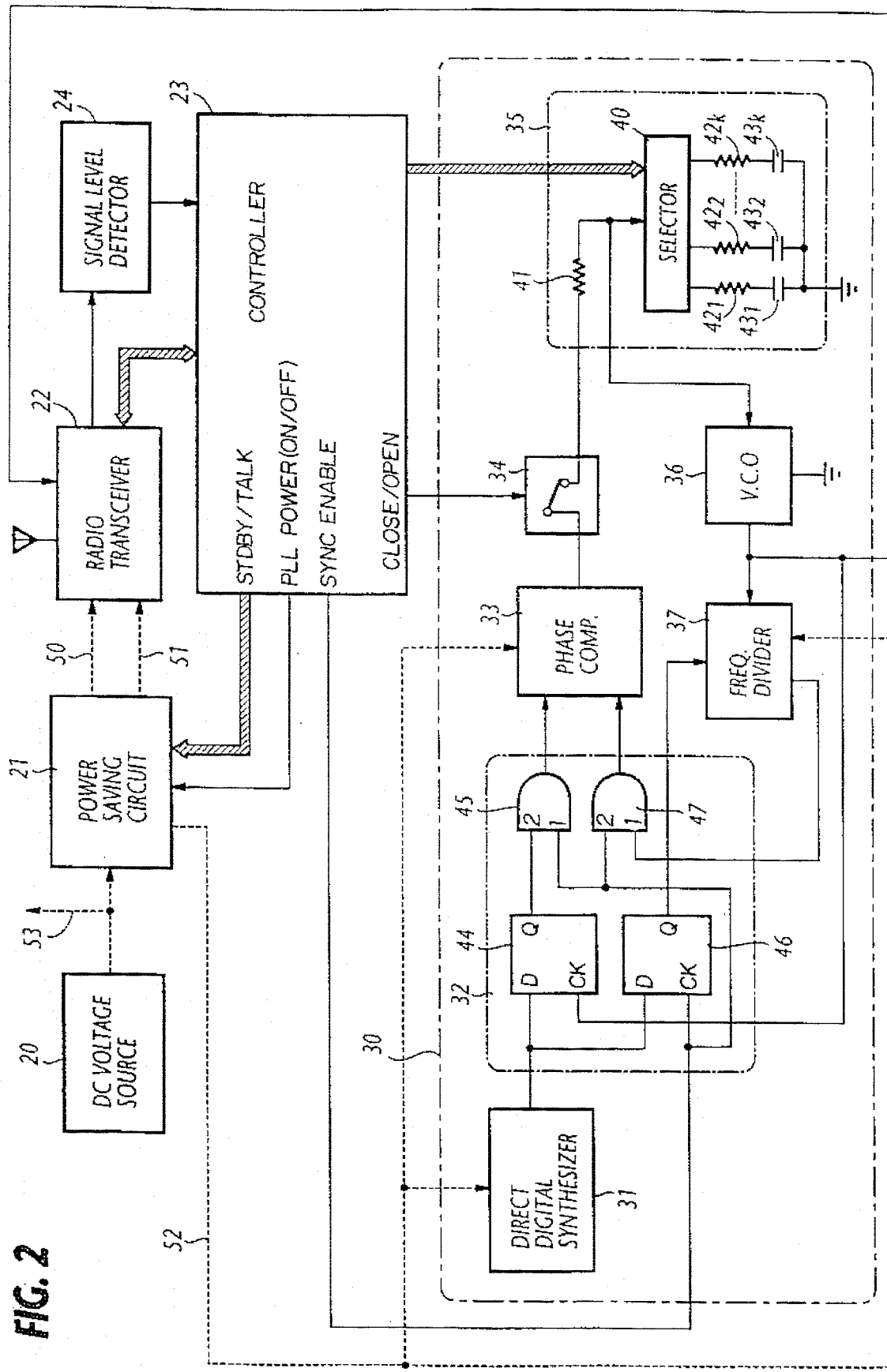
FIG. 2 is a block diagram of a frequency synthesizer and associated TDMA cellular mobile circuitry according to a first embodiment of the present invention.

Referring now to FIG. 2, there is shown a mobile unit according to a first embodiment of the present invention. The mobile unit comprises a digital radio transceiver 22 that transmits an uplink burst in a transmit slot of a TDMA frame to a host cell site station and receives a downlike burst in a receive slot of the frame from the cell site station. The transmit section (transmitter) of transceiver 22 is powered through a power line 50 from a power supply (battery) unit 20 under the control of a power saving circuit 21 and the receive section (receiver) of the transceiver is powered through a power line 51 under the control of power saving circuit 21. A controller 23 is connected to the transceiver 22 to monitor the operating state of the mobile unit and provides power-saving control signals (standby/talk mode and power saving on/off command) to power saving circuit 21 and timing control signals (sync enable and close/open command) to a phase-locked loop 30 in a manner as will be described later. A signal level detector 24 is connected to transceiver 22 and controller 23 to measure the level of a TDMA frame received by the mobile unit.

The phase-locked loop 30 includes a direct digital synthesizer 31, an initial phase alignment circuit, or synchronizer 32, a phase comparator 33, a switch 34, a switched loop-filter bank 35, and a voltage controlled oscillator 36 in which the local carrier of the transceiver 22 is generated. A frequency divider 37 is connected to the output of the VCO 36.

Power saving circuit 21 supplies DC voltage from source 20 to the power draining units of the phase locked loop 30 such as DDS 31, phase comparator 33 and frequency divider 37 via a power line 52 and rams off the power line for power savings, purpose in response to a power saving control signal from the controller 23. The remaining parts of the phase locked loop 30 are directly powered by the voltage source 20 through power line 53.

Figure 3:
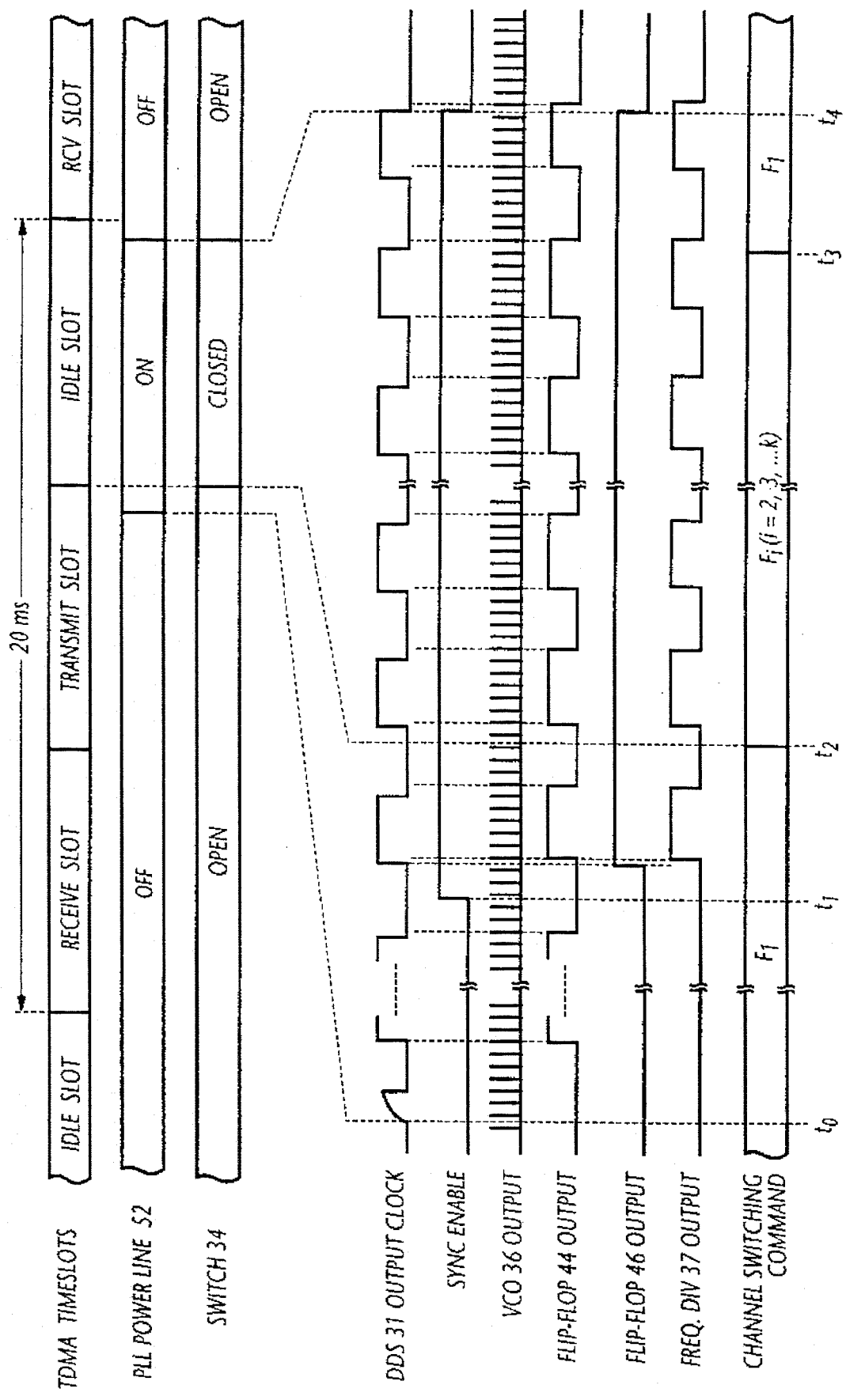
FIG. 3 is a timing diagram associated with the first embodiment of the present invention.

Direct digital synthesizer 31 supplies sharply defined rectangular pulses of reference frequency to the initial phase synchronizer 32. This synchronizer comprises D flip-flops 44, 46 and AND gates 45, 47. Flip-flop 44 receives the outputs of DDS 31 and VCO 36 at its data and clock inputs, respectively, and produces a high-level Q output in response to a pulse from the VCO if the binary level at the data input is high or a low-level Q output in response to the VCO output if the data input's binary level is low. The output of DDS 31 is also applied to the data input of flip-flop 46 to produce a high-level Q output in response to a sync enable pulse applied to its clock input from the controller 23. AND gates 45 and 47 receive this sync enable pulse at their first input and receive the outputs of flip-flop 44 and frequency divider 37 respectively at their second input. AND gate 45 thus produces a pulse whose leading and trailing edges are synchronized with the VCO output pulse. The output of flip-flop 46 is applied to frequency divider 37 as an enable pulse to cause it to output a pulse, while causing it to start a count operation on the input from the VCO so that the output frequency of the divider is a submultiple of the VCO frequency. The output of frequency divider 37 causes AND gate 47 to output a pulse whose leading and trailing edge are timed with the output pulse of frequency divider 37, and hence with the VCO output pulse. Thus, the initial phases off the outputs of flip-flop 44 and frequency divider 37 are synchronized with each other immediately following the leading edge of the sync enable pulse as shown in FIG. 3, and these output pulses are passed respectively through AND gates 45 and 47 to the respective inputs of phase comparator 33.

Phase comparator 33 is any of conventional logic circuits which produces a high-level output at one of two output terminals when one of the inputs to the comparator is advancing with respect to the other and produces a high-level output at the other output terminal when the input phase relation is reversed. A circuit known as a charge-pump is connected to the output terminals of the logic circuit for charging a loop filter when one of the outputs is driven high and drawing a charge from the loop filter when the other output is driven high.

According to the first embodiment, the switched loop-filter bank 35 receives a channel switching command from the controller 23 to provide a channel search during talking modes. Specifically, it comprises a selector 40, a resistor 41 connected between the output terminal of switch 34 and the input terminal of selector 40, and a bank of resistor-capacitor networks (resistors $42_1$–$42_k$ and capacitors $43_1$–$43_k$) connected between respective output terminals of selector 40 and ground. Selector 40 is responsive to the channel switching command from the controller 23 for selectively establishing a connection between resistor 41 and one of the resistor-capacitor networks. A loop filter of a unique cutoff frequency is formed by the resistor 41 and a selected one of the RC networks between the output of switch 34 and ground in accordance with the channel switching command. When the switch 34 is in a closed state, the charge-pump of phase comparator 33 pumps a charge into or draws a charge from the capacitor of the selected RC network, so that a voltage corresponding to the phase difference is developed at the junction between resistor 41 and the input of selector 40 and applied as a frequency control voltage to the VCO 36.

When the switch 34 is opened in response to an open-loop command from the controller 23, the control voltage developed by the capacitor of the selected RC network is held and maintained in the loop filter as long as the switch 34 is in the open state, and hence, the VCO 36 can be instantly switched back to the frequency of the currently assigned speech channel after the mobile unit has been switched to the frequency of the adjacent cell for a possible hand-off.

The TDMA cellular communication system of the present invention uses a frame format as shown in FIG. 3. Each cell site of the system is allocated a unique frequency according to the system's frequency reuse plan. The frequency assigned to each cell site carries a TDMA frame comprising a plurality of 20-ms two-way channels, each comprising a receive slot for receiving a downlink burst from the cell site station, a transmit slot for transmitting an uplink burst from the mobile unit, and an idle timeslot in which the mobile unit is allowed to make a channel search in preparation for a possible hand-off from the current cell to an adjacent cell.

Figure 4:
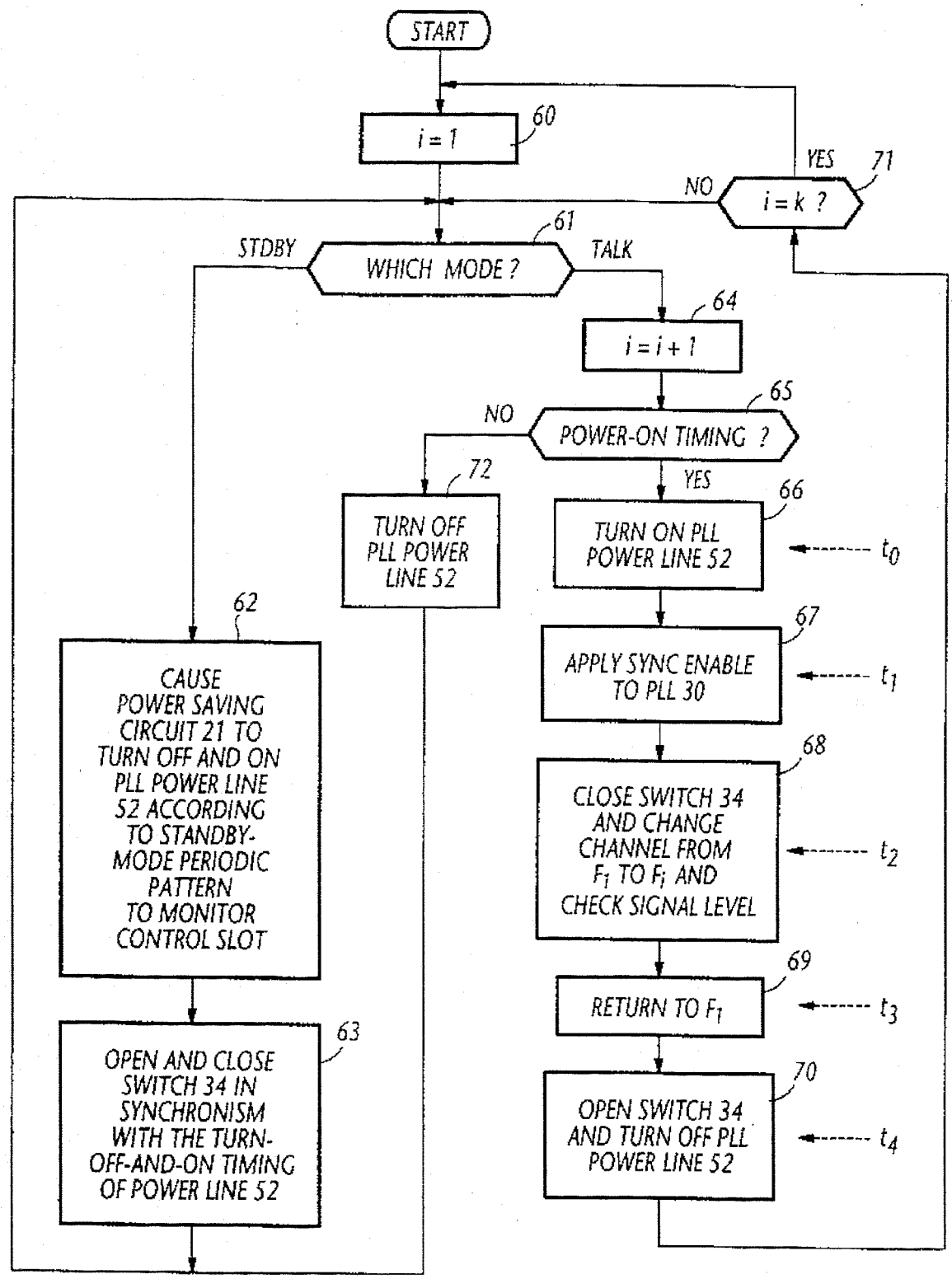
FIG. 4 is a flowchart diagram associated with the first embodiment of the present invention.

The operation of the tint embodiment will be given below with reference to a flowchart shown in FIG. 4 in which a sequence of operational steps performed by the controller 23 is illustrated. Program execution starts with decision block 60 which initializes the adjacent channel index variable "i" to one. Exit then is to block 61 to check to see if the mobile unit is in a standby or a talking mode. If control determines that it is in a standby mode, control branches at block 61 to block 62 to cause the power saving circuit 21 to interrupt the power applied to the PLL power line 52 according to the conventional standby-mode periodic power-saving pattern, thus allowing the mobile unit to access the control slot of the TDMA frame to determine whether there is an incoming call from the host cell site. More specifically, the standby-mode periodic power-saving pattern is such that power saving circuit 21 turns off the transmitter continuously during this mode to save its power consumption, and periodically turns on the receiver for an interval slightly longer than the TDMA frame period to allow the controller 23 to monitor the control slot of the TDMA frame of the current cell, and then turns it off for an interval much longer than the frame period to conserve its power. During the standby mode, the controller 23 controls the selector 40 of the loop-filter bank 35 to connect the resistor 41 to resistor 421 and capacitor 431 to allow the receiver to tune to channel frequency $F_1$ of the cell in which the mobile unit is currently located. Control then advances to block 63 to open and close the PLL switch 34 in synchronism with the turn-off and turn-on timing of power line 52 (and hence, the receiver's turn-off and turn-on timing), and returns to block 61 to repeat the process.

When the switch 34 is in a closed state, capacitor $43_1$ is driven by the output of phase comparator 33 to develop a control voltage for the VCO 36. When the switch 34 is open, the phase locked loop 30 operates in an open-loop mode, and the control voltage supplied previously to the VCO is maintained by capacitor $43_1$. The closed and open states of the PLL loop are repeated as long as the mobile unit is a standby mode according to the standby-mode periodic interruption pattern.

If control determine at block 61 that the mobile unit is in a talking mode, it branches to block 154 to increment the variable "i" to one, and proceeds to block 65 to determine whether power-on timing is approached. This timing is used to turn on the phase locked loop immediately prior to the beginning of an assigned idle slot to allow the phase locked loop to tune to a selected channel frequency within the period of the subsequent idle slot. If the answer is negative at block 65, control branches at block 72 to turn off the PLL power line 52, and returns to block 61, and if the answer is affirmative, control branches to block 66 to turn on the PLL power line 52 (time $t_0$, FIG. 3). Exit then is to block 67 to apply a sync enable pulse to the initial phase synchronizer 32 of the PLL (at time $t_1$) so that phase comparator 33 is supplied with phase-aligned input pulses. The establishment of this initial phase synchronization allows phase locked loop 30 to quickly converge to a stabilized state. Controller 23 then proceeds to block 68 to supply a turn-on signal to close the switch 34 (time $t_2$) and to switch the receivers frequency from $F_1$ to $F_i$ by applying a change-to-$F_i$ command to selector 40. Phase locked loop 30 now operates in a closed loop using the resistor $42_2$ and capacitor $43_2$.

The receiver is thus tuned to the channel of an adjacent cell and the signal level of this channel is determined by the signal level detector 24 and informed to the controller 23 where it is analyzed to determine whether a hand-off is to be performed. Controller 23 may have completed this determination until time $t_3$. Controller 23 then supplies a change-to-$F_1$ command to selector 40 (block 69) to return the receiver's frequency to $F_1$. Since the voltage previously developed in capacitor during the open-loop mode prior to time to is maintained, it is reapplied to the VCO when the selector 40 is switched to the previous position, and the phase locked loop 30 continues to operate in a closed-loop mode with the VCO being supplied with the previous control voltage. Therefore, the phase-locked loop 30 can be stabilized to frequency $F_1$, allowing the receiver to return to the channel of the current cell within the assigned idle slot. Control then proceeds to block 70 to apply a turn-off signal to the switch 34 and a PLL-power turn-off command to power saving circuit 21 to cause it to turn off the PLL power line 52 (time $t_4$). This occurs prior to the arrival of a subsequent receive slot which is assigned to another mobile unit. Exit then is to block 71 to check to see if i=k. If it is not, control returns block 61 to repeat the above process on the channels of the other adjacent cells, and if it is control returns to block 60 to repeat the process all over again. It is seen that during the period between times $t_3$ and $t_4$, capacitor $43_1$ is driven in a phase-locked mode to update its voltage level for the subsequent open-loop operation.

When the talking mode proceeds, power saving controller 21 turns off the transmitter during an assigned receive slot as well as on an assigned idle slot and turns it on during an assigned transmit slot, while turning the receiver off during each transmit slot and turning it on during the assigned receive and idle slots.

Figure 5:
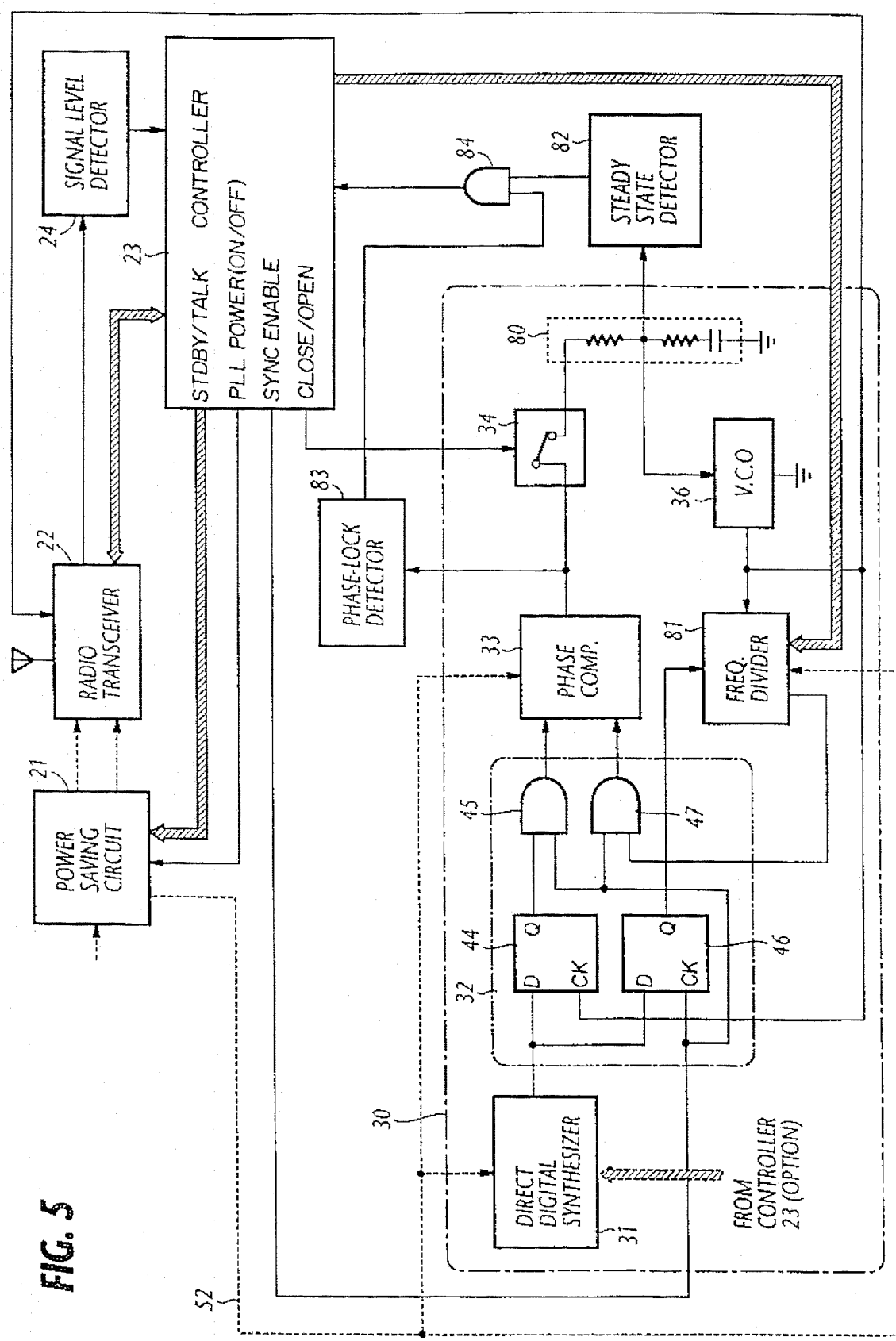
FIG. 5 is a block diagram of a frequency synthesizer and associated TDMA cellular mobile circuitry according to a second embodiment of the present invention.

FIG. 5 Is a block diagram of a second embodiment of the present invention in which parts corresponding to those in FIG. 2 are marked with the same numerals as those used in FIG. 2, and the description thereof are omitted for simplicity. This embodiment differs from the first embodiment by the use of a single loop filter 80 instead of the switched filter bank 35 and a variable frequency divider 81 whose dividing ratio is varied in response to the channel switching command of the controller 23. Alternatively, the DDS 31 could be designed to receive channel selection command from the controller 234 to produce a reference pulse of desired frequency, instead of the use of the variable frequency divider 81.

When channel switching occurs, a rapid voltage change would occur at the input of the loop filter 80, and a dielectric absorption current flows, causing voltage fluctuations to occur in the loop filter. A steady state detector 82 is connected to the loop filter 80 to determine whether such voltage fluctuations are stabilized and converged to within a narrow voltage range. A phase-lock detector 83 is connected to the output of phase comparator 33 to detect a phase comparator output which indicates that a phase-lock condition is established in the loop and produce a phase-lock detect signal. The output signals of steady state detector 82 and phase-lock detector 83 are applied to an AND gate 84, whose output is supplied to controller 23 as a signal to allow it to determine the time at which the phase locked loop is to be opened again.

Figure 6:
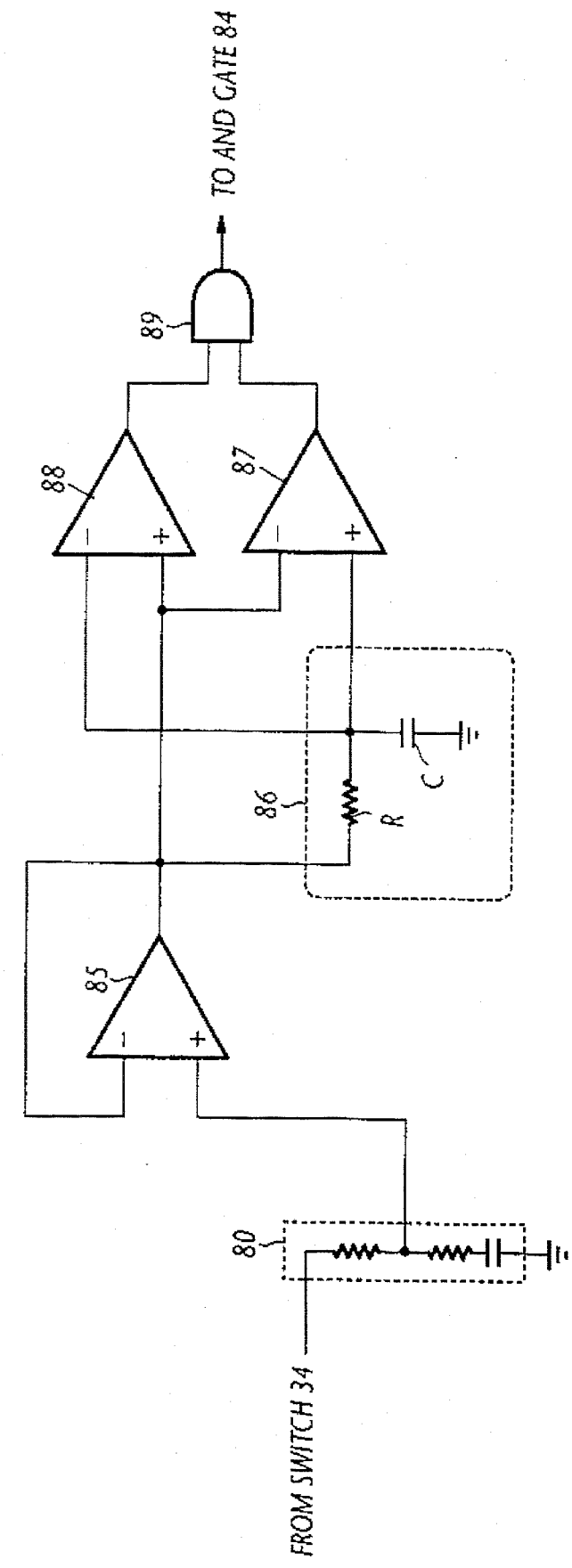
FIG. 6 is a circuit diagram showing details of a steady state detector.

FIG. 6 shows details of the steady state detector 82. As illustrated, it comprises a voltage follower 85 connected to the loop filter 80. The output of the voltage follower 85 is connected over two paths to comparators 87 and 88, one being a delay-line path through a resistor-capacitor delay circuit 86 to the positive input of comparator 87 and to the negative input of comparator 88, and the other being a direct path to the negative input of comparator 87 and the positive input of comparator 88. The outputs of both comparators are applied to an AND gate 89 to produce a steady-state detect signal for coupling to the AND gate 84. Comparators 87 and 88 both produce a logic-1 signal when the delayed output becomes smaller than the offset voltage of the comparators.

Figure 7:
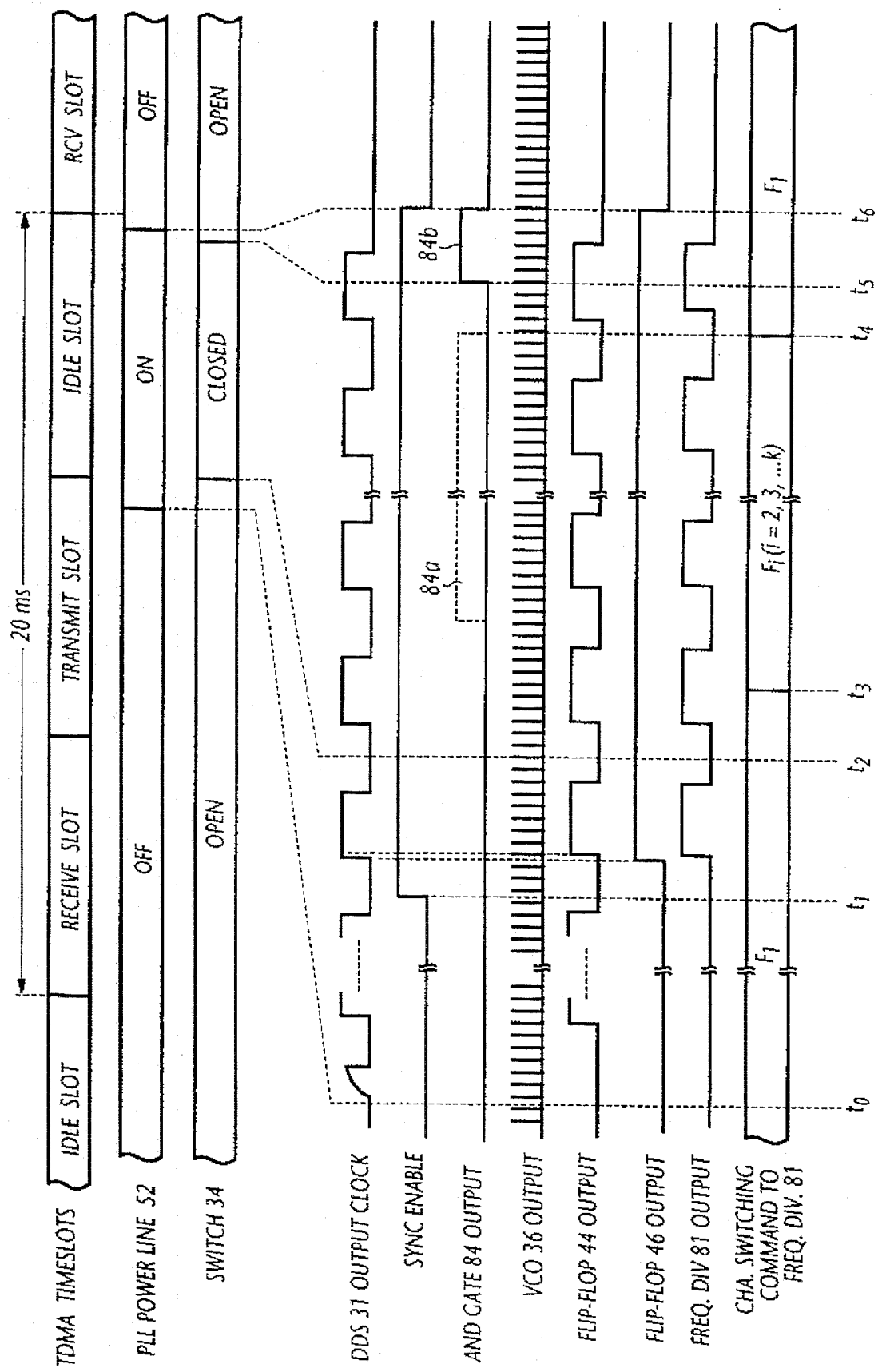
FIG. 7 is a timing diagram associated with the second embodiment of the present invention.
Figure 8:
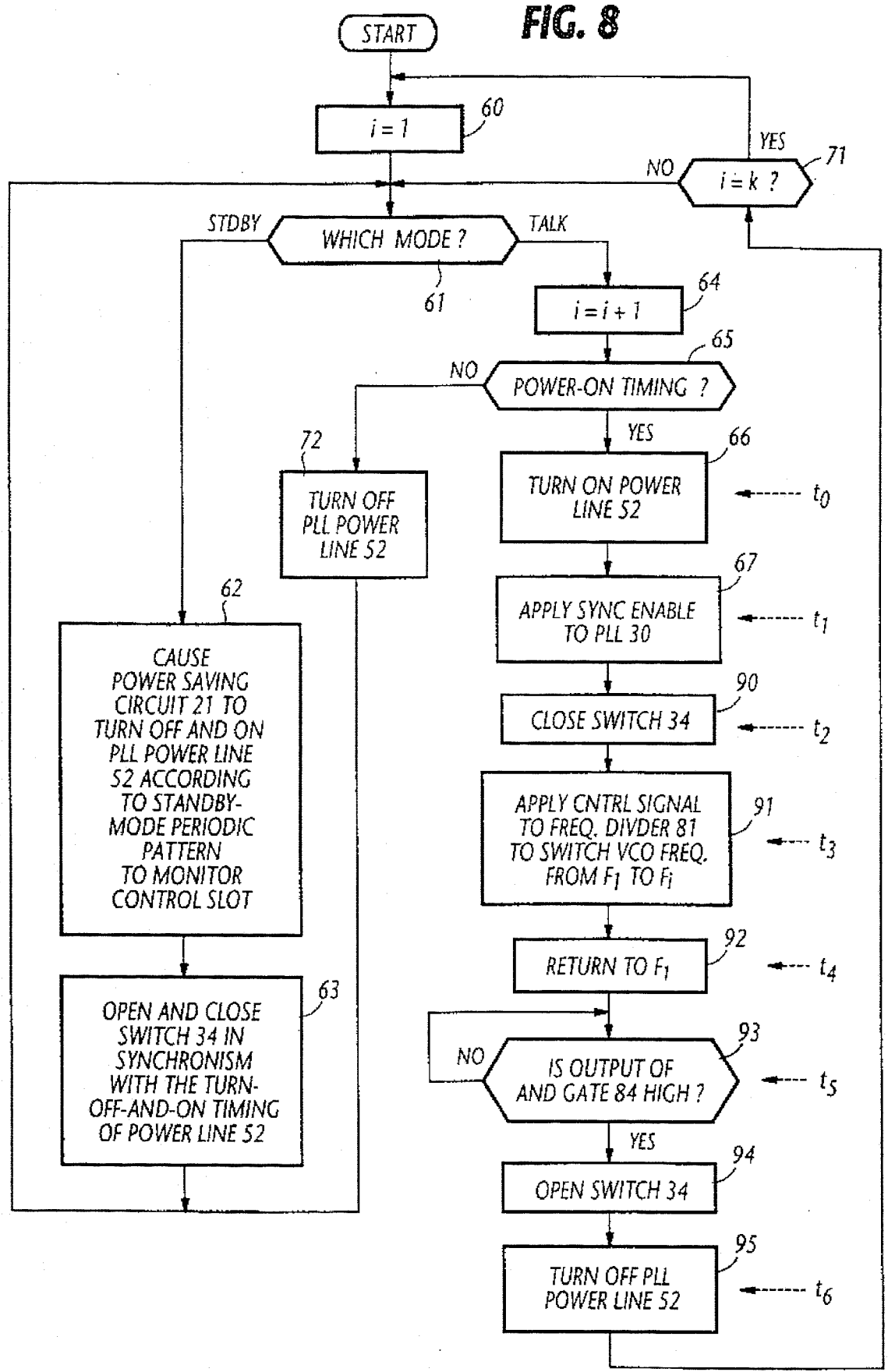
FIG. 8 is a flowchart diagram associated with the second embodiment of the present invention.

The operation of the controller 23 of FIG. 5 will be described with reference to a timing diagram and a flowchart respectively shown in FIGS. 7 and 8. Referring to FIG. 8, the operation of the controller is illustrated which differs from the previous embodiment in that it uses blocks 90 to 95 instead of blocks 68 to 70 of FIG. 4. During the open-loop mode prior to the turn-on of power line 52 at time $t_0$, the loop filter 80 maintains a constant voltage and the VCO 36 is driven with this voltage. At time $t_0$, the frequency divider 81 is turned on to receive the output of the VCO whose frequency is the same as the open-loop mode. Therefore, the frequency of the output of the frequency divider 81 is approximately the same as the frequency generated during the previous open-loop mode. In response to the application of a sync enable pulse to the PLL 30 at time $t_1$ (block 67), the output of frequency divider 81 and the reference input of phase comparator 33 are quickly brought into phase in the same manner as in the previous embodiment.

Control now proceeds to block 90 to close the switch 34 at time $t_2$. Exit then is to block 91 to apply a channel switching command to the frequency divider 81 at time $t_3$ so that VCO 36 will then be caused to change its output frequency from $F_1$ to $F_i$ through a closed-loop mode of operation. When the phase locked loop 30 subsequently enters a phase lock state and the VCO frequency is stabilized to $F_i$, the output of AND gate 84 will switch to logic 1 as indicated at 84a in FIG. 7. However, the controller 23 ignores this signal. When the controller 23 completes a channel switching for a hand-off to an adjacent cell, it returns to the channel of the current cell at time $t_4$ (block 92) by applying a control signal to the frequency divider 92 so that the VCO 36 switches its output frequency from $F_i$ back to $F_1$. The switching of frequencies causes the phase lock loop 30 to unlock again as at time $t_3$ and the output of AND gate 84 goes low at time $t_4$. If the PLL 30 subsequently enters a phase lock state and the voltage at the loop filter 80 is stabilized at time $t_5$, controller 23 will receive a logic-1 output 84b from the AND gate 84 as it executes block 93 and turns off the switch 34 (block 94). Controller 23 proceeds to block 95 to turn off the PLL power line 52 at time $t_6$ prior to the next receive slot. The PLL 30 is open again and the VCO 36 is continuously supplied with a voltage maintained by the loop filter 80.

Figure 9:
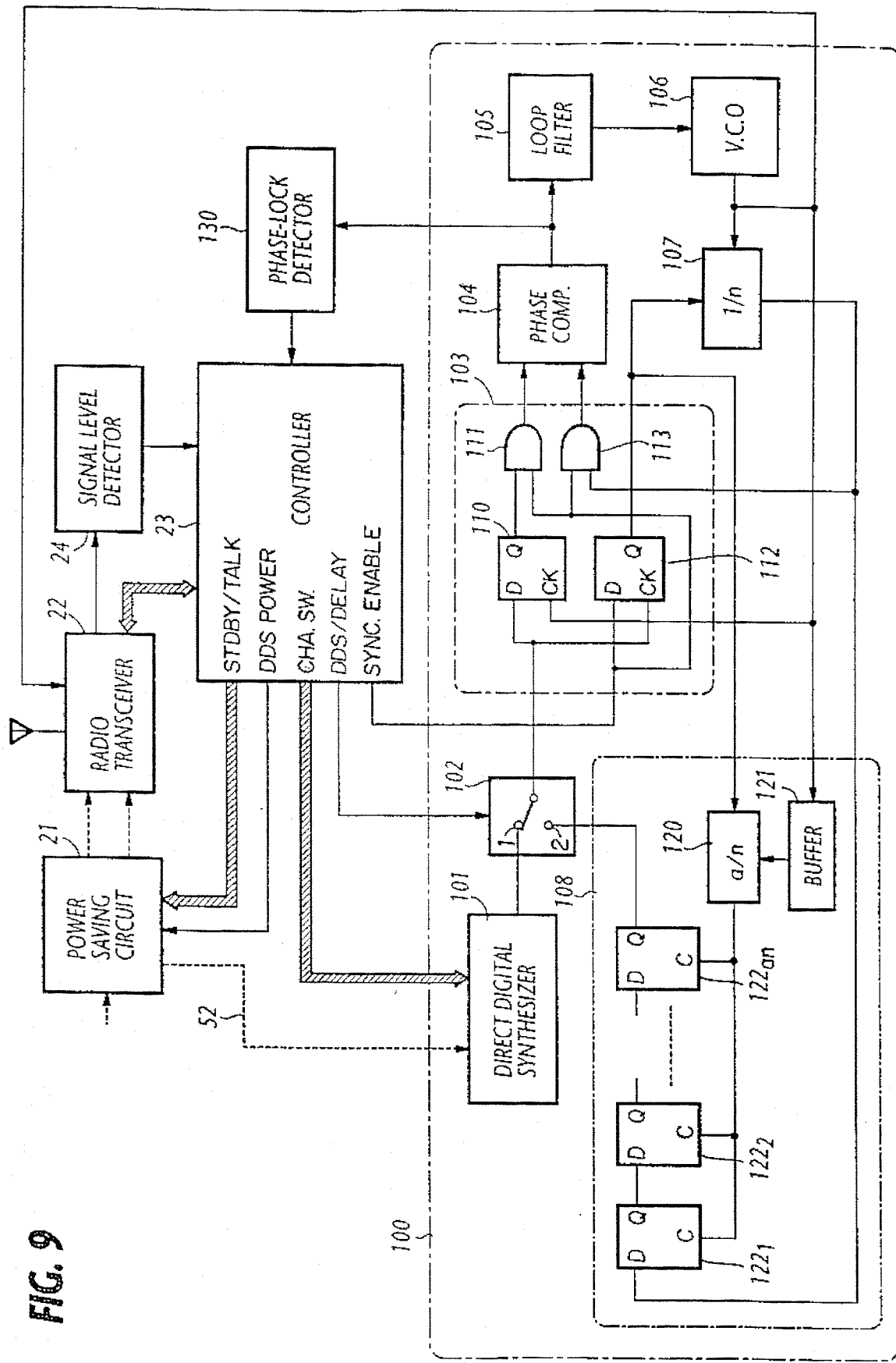
FIG. 9 is a block diagram of a frequency synthesizer and associated TDMA cellular mobile circuitry according to a third embodiment of the present invention.

A third embodiment of the present invention is shown in FIG. 9 in which parts corresponding to those in the previous embodiments are marked with the same numerals. In this embodiment, a phase locked loop 100 comprises a direct digital synthesizer 101 whose output frequency is controlled by the channel switching command of the controller 23. The output of the DDS 101 is coupled through the first terminal of a changeover switch 102 to an initial phase synchronizer 103 comprising D flip-flops 110, 112 and AND gates 111, 113 identical In structure to the synchronizer 32 of the previous embodiments. The outputs of synchronizer 103 are compared by phase comparator 104 whose output is coupled via a loop filter 105 to a VCO 106. A divide-by-n frequency divider 107, which is arranged to be enabled by the output of flip-flop 112, is connected to the output of VCO 106 to supply its output to AND gate 113 and to an n-pulse delay circuit 108.

In the delay circuit 108 a divide-by-(a/n) frequency divider 120 is arranged to be enabled by the output of flip-flop 112 to receive the output of the VCO 106 through a delay buffer 121. The output of frequency divider 120 is applied to the clock inputs of D flip-flops $122_1$ through $122_{an}$ which are connected in successive stages to form a delay line in which "n" pulses of frequency divider 107 are stored. The first stage flip-flop $122_1$ receives the output of frequency divider 107 at its data input. Each flip-flop receives the output of the preceding stage and applies its output to the data input of the next stage. The last stage flip-flop $122_{an}$ applies its output to the second terminal of changeover switch 102. During closed-loop modes, the switch 102 is positioned to the first terminal for coupling the output of DDS 101 to the phase synchronizer 103, and during open-loop modes, it is switched to the second terminal for coupling the output of flip-flop $122_{an}$ in response to a switching control signal from the DDS/DELAY port of the controller 23. A phase-lock detector 130 is connected to the output of phase comparator 104 to detect a phase lock state of the loop and communicates this fact to the controller 23. As will be understood, since phase comparator 104 and frequency divider 107 are permanently powered to activate the phase lock loop, it is only the DDS 101 that is made inactive during transmit and receive slots and made active through power line 52 during specified idle slots.

Figure 10:
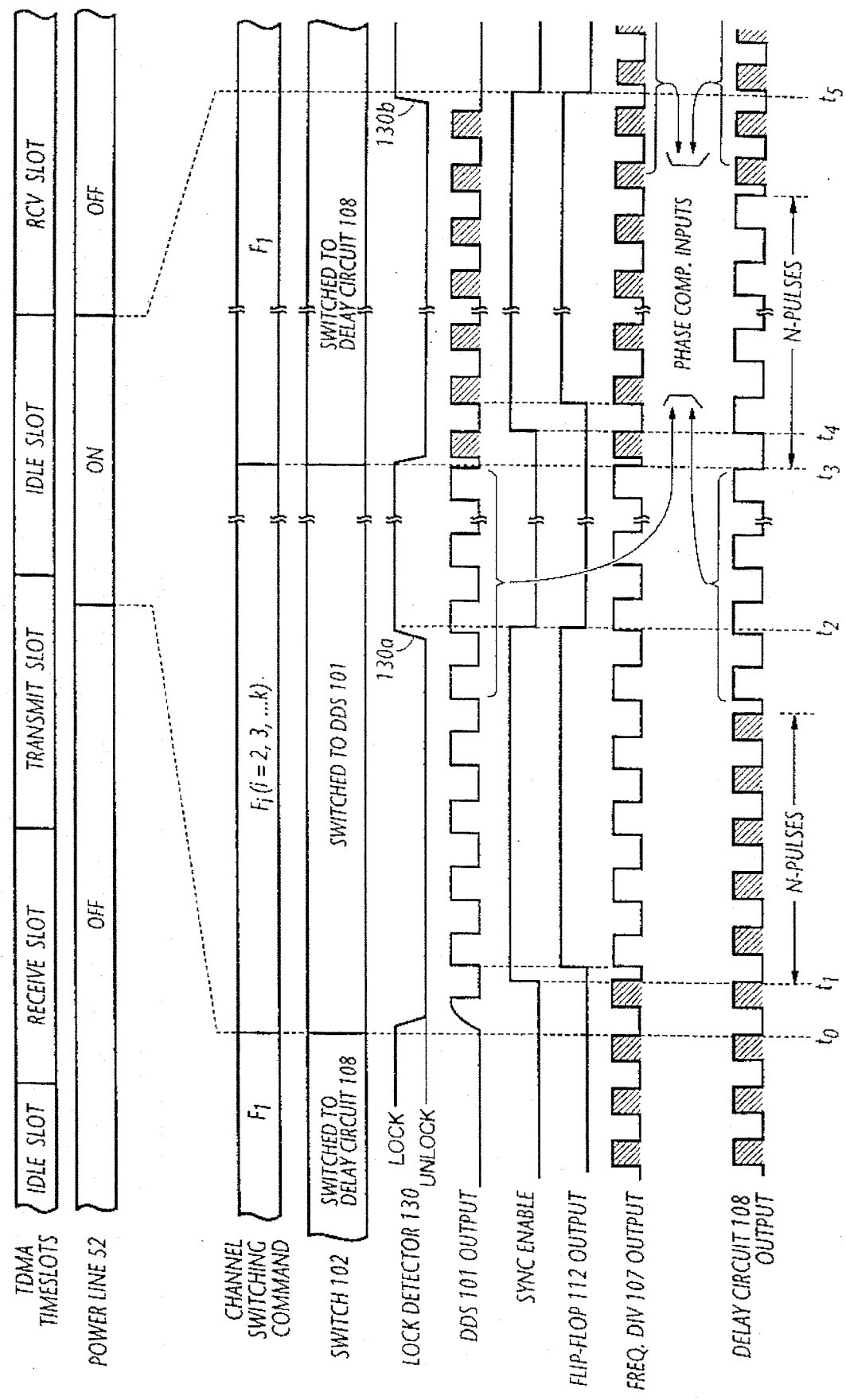
FIG. 10 is a timing diagram associated with the third embodiment of the present invention.
Figure 11:
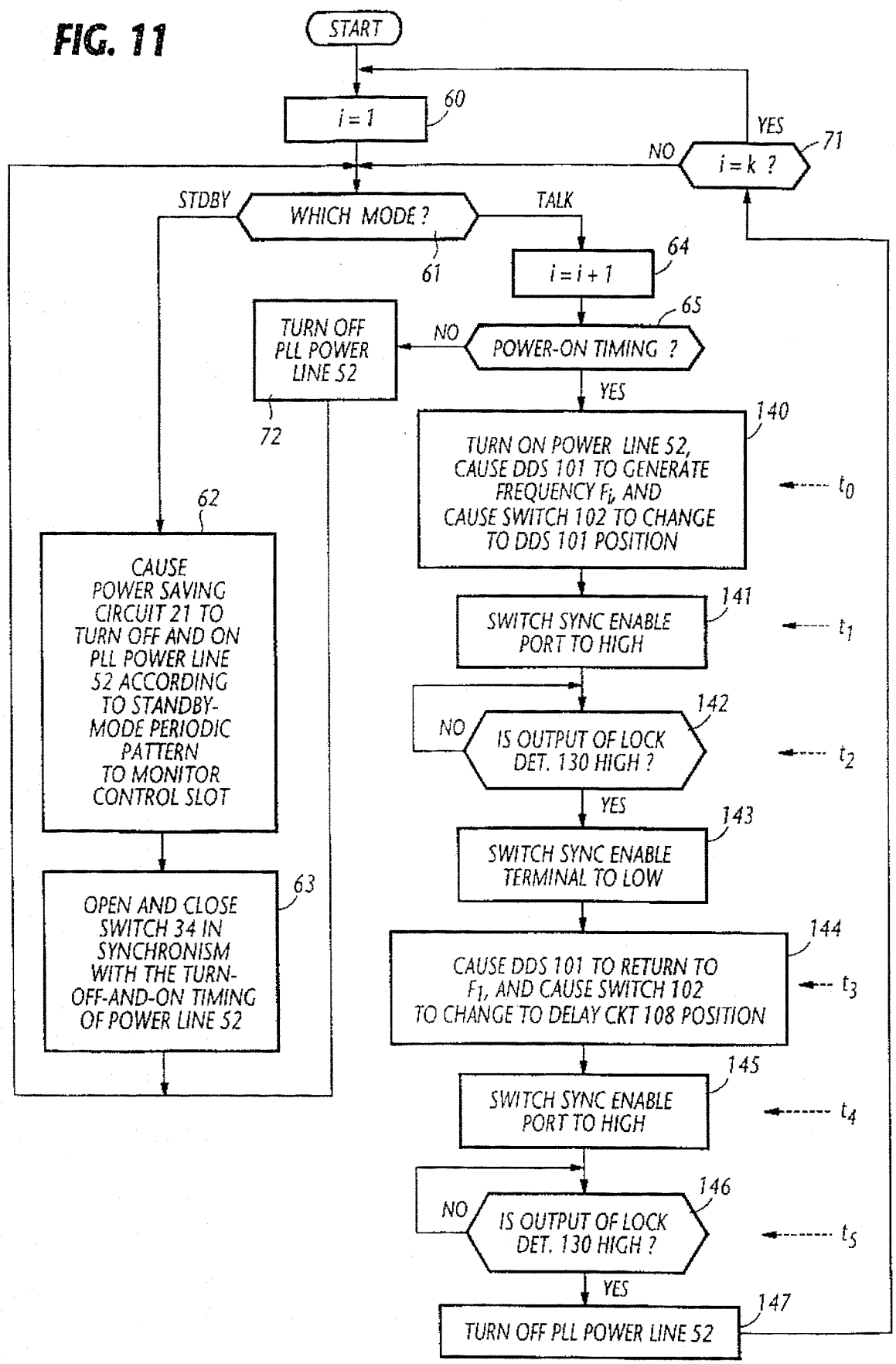
FIG. 11 is a flowchart diagram associated with the third embodiment of the present invention.

The operation of the controller 23 of FIG. 9 will be described with reference to a timing diagram and a flowchart respectively shown in FIGS. 10 and 11. Referring to FIG. 11, the operation of the controller is illustrated which differs from the first embodiment in that it uses blocks 140 to 147 instead of blocks 66 to 70 of FIG. 4.

Initially, the output of DDS 101 is at frequency $F_1$ and applied through synchronizer 103 to phase comparator 104 where it is phase-compared with the output of frequency divider 107. When the loop is phase-locked, the controller 23 is notified of this fact from phase-lock detector 130 to cause the changeover switch 102 to switch from the first to the second terminal, so that the phase lock loop 100 is switched from an externally-driven, closed loop mode to a self-driven, closed loop mode in which the frequency divider 107 is producing a pulse at 1/n of frequency $F_1$ as indicated by hatched pulses in FIG. 10. Thus, the phase lock loop 100 is usually in the self-driven mode to allow the DDS 101 to be turned off.

Following the execution of block 65, control exits to block 140 to turn on power line 52 to activate the DDS 101 while supplying to it a channel switching command which causes it to tune to frequency $F_i$ and the switch 102 is controlled to change its position to the first terminal for coupling the delayed output of frequency divider 107. Control advances to block 141 to place a logic-1 level to its sync enable port at time $t_1$ (see also FIG. 10). The output of frequency divider 107 will then be brought into phase with the output of DDS 101 and begins to generate a series of pulse at 1/n of the frequency $F_i$ of an adjacent cell. After a sequence of "n" pulses has been delivered from the; delay circuit 308 during a period from time $t_1$, the inputs of phase comparator 104 begin to match in frequency and in phase, and a phase lock condition is detected by phase lock detector 130, producing a first phase-lock signal 130a at time $t_2$. Controller 23 detects this signal as it subsequently executes decision block 142, and proceeds to block 143 to switch the sync enable port to low level.

Exit then is to block 144 to cause DDS 101 to return to the original setting so that the output of VCO 107 is returned to frequency $F_1$ and cause the changeover switch 102 to move to the second terminal for coupling the output of delay circuit 108 to the phase synchronizer 103 (at time $t_3$). Since one of the inputs of the phase comparator 104 changes in frequency while the frequency of the other input remains unchanged until "n" pulses are output from delay circuit 108, the phase lock loop 100 unlocks and the output of phase-lock detector 130 goes low at time $t_3$ (FIG. 10). Control then proceeds to block 145 to switch the binary state of the sync enable port to high again at time $t_4$ to enable a phase match to quickly occur between signals at the phase comparator inputs. Control then executes block 146 by examining the output of phase lock detector 130. Following the delivery of "n" pulses from the delay circuit 108 that have been generated within the period after time $t_4$, the phase lock loop 100 will be locked at time $t_5$ and the phase detector 130 informs this fact to controller 23 with a second phase-lock signal 130b, which responds to it by executing block 147 in which it instructs the power saving circuit 21 to turn off the PLL power line 52.

What is claimed is:

1. A frequency synthesizer of a mobile unit for a time division multiple access (TDMA) cellular communication system, said system having a plurality of cell sites each being assigned a channel of unique frequency for carrying a TDMA frame having a sequence of receive and transmit slots and at least one idle slot, comprising:

a reference pulse source for generating a train of reference pulses;

a phase comparator for generating a phase difference signal indicative of the phase difference between two input signals applied thereto;

a switched filter bank comprising a plurality of loop filters each of said loop filters having a unique cutoff frequency;

selector means for selecting one of the loop filters in response to a channel selection signal;

switch means for establishing a connection between the output of said phase comparator and the selected loop filter in response to a close-loop command signal to cause the selected loop filter to develop a voltage according to said phase difference signal and clearing said connection in response to an open-loop command signal, wherein the voltage developed in the selected loop filter is maintained after said connection is cleared and is maintained when another loop filter is selected;

a voltage-controlled oscillator connected to the selected loop filter for generating an output signal at a frequency corresponding to the voltage developed by the selected loop filter;

a frequency divider connected to said voltage-controlled oscillator for producing an output pulse at a submultiple of an output frequency of the voltage-controlled oscillator;

a phase alignment circuit for establishing initial phase alignment between an output pulse from said frequency divider and a reference pulse from said reference pulse source in response to an enable signal applied thereto and applying the phase-aligned signals to said phase comparator as said two input signals; and control means for causing the mobile unit to scan a different one of the plurality of cell sites during each of a plurality of idle slots and to return to a receive or transmit frequency during the respective receive and transmit slots by providing a series of channel selection signals which alternately select between one of the plurality of loop filters during an idle slot and a loop filter which corresponds to the receive or transmit frequency during the respective receive and transmit slots so that a different one of the plurality of loop filters is selected for each of a plurality of successive idle slots by generating said open-loop command signal during said receive and transmit slots of the TDMA frame, and generating said close-loop command signal, said enable signal and said channel selection signal during the idle slot of the TDMA frame, and for deactivating said reference pulse source during said receive and transmit slots and activating said reference pulse source during said idle slot of the TDMA frame.

2. A frequency synthesizer of a mobile unit for a time division multiple access (TDMA) cellular communication system, said system having a plurality of cell sites each being assigned a channel of unique frequency for carrying a TDMA frame having a sequence of receive and transmit slots and at least one idle slot, comprising:

a reference pulse source for generating a train of reference pulses;

a phase comparator for generating a phase difference signal indicative of the phase difference between two input signals applied thereto;

a loop filter;

means for establishing a connection between the output of said phase comparator and said loop filter in response to a close-loop command signal to cause the selected loop filter to develop a voltage according to said phase difference signal and clearing said connection in response to an open-loop command signal;

a voltage-controlled oscillator connected to the loop filter for generating an output signal at a frequency corresponding to the voltage developed by the loop filter;

a frequency divider connected to said voltage-controlled oscillator for producing an output pulse at a frequency which is a submultiple of the frequency of the output from the voltage-controlled oscillator;

a phase alignment circuit for establishing initial phase alignment between an output pulse from said frequency divider and a reference pulse from said reference pulse source in response to an enable signal applied thereto and applying the phase-aligned signals to said phase comparator as said two input signals;

a phase-lock detector connected to the phase comparator for producing a phase-lock detecting signal when said phase difference indicates that said two input signals are locked in phase;

means for generating a steady-state detect signal indicating that the voltage developed in said loop filter has attained a substantially steady value;

gate means for generating a signal indicating that said phase-lock detect signal and said steady-state detect signal are simultaneously present; and control means for causing the mobile unit to scan a different one of the plurality of cell sites during each of a plurality of idle slots and to return to a receive or transmit frequency during the respective receive and transmit slots by generating said open-loop command signal during said receive and transmit slots of the TDMA frame, and generating said close-loop command signal and said enable signal and a channel selection signal during the idle slot of the TDMA frame, and deactivating said reference pulse source during said receive and transmit slots and activating said reference pulse source during said idle slot of the TDMA frame, and applying said channel selection signal to one of said reference pulse source and said frequency divider so that the output of said voltage-controlled oscillator is varied according to the channel selection signal and responding to the signal from said gate means after said channel selection signal is generated for determining a transition from said close-loop command signal to said open-loop command signal.

3. A frequency synthesizer as claimed in claim 1 or 2, wherein said control means include means for deactivating said frequency divider and said phase comparator during said transmit/receive slot and activating said frequency divider and said phase comparator during said idle slot.

4. A frequency synthesizer of a mobile unit for a time division multiple access (TDMA) cellular communication system, said system having a plurality of cell sites each being assigned a channel of unique frequency for carrying a TDMA frame having a sequence of receive and transmit slots and at least one idle slot, comprising:

a reference pulse source for generating a train of reference pulses;

a phase comparator for generating a phase difference signal indicative of the phase difference between two input signals applied thereto;

a loop filter;

means for establishing a connection between the output of said phase comparator and said loop filter in response to a close-loop command signal to cause the selected loop filter to develop a voltage according to said phase difference signal and clearing said connection in response to an open-loop command signal;

a voltage-controlled oscillator connected to the loop filter for generating an output signal at a frequency corresponding to the voltage developed by the loop filter:

a frequency divider connected to said voltage-controlled oscillator for producing an output pulse at a frequency which is a submultiple of the frequency of the output from the voltage-controlled oscillator;

a phase alignment circuit for establishing initial phase alignment between an output pulse from said frequency divider and a reference pulse from said reference pulse source in response to an enable signal applied thereto and applying the phase-aligned signals to said phase comparator as said two input signals;

a phase-lock detector connected to the phase comparator for producing a phase-lock detecting signal when said phase difference indicates that said two input signals are locked in phase;

means for generating a steady-state detect signal indicating that the voltage developed in said loop filter has attained a substantially steady value;

gate means for generating a signal indicating that said phase-lock detect signal and said steady-state detect signal are simultaneously present;

control means for generating said open-loop command signal during said receive and transmit slots of the TDMA frame, and generating said close-loop command signal and said enable signal and a channel selection signal during the idle lot of the TDMA frame, and deactivating said reference pulse source during said receive and transmit slots and activating said reference pulse source during said idle slot of the TDMA frame, said control means applying said channel selection signal to one of said reference pulse source and said frequency divider so that the output of said voltage-controlled oscillator is varied according to the channel selection signal and responding to the signal from said gate means after said channel selection signal is generated for determining a transition from said close-loop command signal to said open-loop command signal;

first and second D flip-flops each having a data input port connected to receive said reference pulse and a clock input port, the clock input of the first D flip-flop being responsive to the output of said voltage-controlled oscillator and the clock input of the second D flip-flop being responsive to the enable signal from said control means, said second D flip-flop producing an output for enabling said frequency divider to produce an output thereof; and first and second coincidence gates each having first and second input ports, the first input ports of said first and second coincidence gates being connected to be responsive to the enable signal from said control means, the second input port of the first coincidence gate being connected to be responsive to an output of said first D flip-flop for generating one of the input signals of said phase comparator, and the second input port of the second coincidence gate being connected to be responsive to the output of said frequency divider for generating the other input signal of said phase comparator.

5. A frequency synthesizer of a mobile unit for a time division multiple access (TDMA) cellular communication system, said system having a plurality of cell sites each being assigned a channel of unique frequency for carrying a TDMA frame having a sequence of receive and transmit slots and at least one idle slot, comprising:

a reference pulse source for generating a train of reference pulses;

a phase comparator for generating a phase difference signal indicative of the phase difference between two input signals applied thereto;

a loop filter connected to the phase comparator to develop a voltage corresponding to said phase difference signal;

a voltage-controlled oscillator connected to the loop filter for generating an output signal at a frequency corresponding to the voltage developed by the loop filter;

a frequency divider connected to said voltage-controlled oscillator for producing an output pulse at a frequency which is a submultiple of the frequency of the output from the voltage-controlled oscillator;

a phase alignment circuit for establishing initial phase alignment between an output pulse from said frequency divider and a reference pulse from said reference pulse source in response to an enable signal applied thereto and applying the phase-aligned signals to said phase comparator as said two input signals;

a delay circuit for delaying the output of said frequency divider for a predetermined interval;

a phase-lock detector connected to the phase comparator for producing a phase-lock detecting signal when said phase difference indicates that said two input signals are locked in phase;

switch means for exclusively connecting the reference pulse of said reference pulse source to said phase alignment circuit in response to a first mode signal applied thereto and exclusively connecting the output of the delay circuit to said phase alignment circuit in response to a second mode signal applied thereto; and control means for causing the mobile unit to scan a different one of the plurality of cell sites during each of a plurality of idle slots and to return to a receive or transmit frequency during the respective receive and transmit slots by generating said first mode signal, said enable signal and a channel selection signal during the idle slot of a TDMA frame, and generating said second mode signal during said receive and transmit slots of the TDMA frame, and switching said reference pulse source into an inactive state during said receive and transmit slots and into an active state during said idle slot of the TDMA frame, and applying said channel selection signal to said reference pulse source so that the output of said voltage-controlled oscillator is varied according to the channel selection signal and responding to a first phase-lock detect signal generated by said phase-lock detector in the presence of said first mode signal for determining a transition from said finest mode signal to said second mode signal and responding to a second phase-lock detect signal generated by said phase-lock detector in the present of said second mode signal for determining a transition from the active state of the reference pulse source to the inactive stage thereof.

6. A frequency synthesizer as claimed in claim 5, wherein said frequency divider is a divide-by-N frequency divider and said delay circuit comprises means for storing at least N pulses from said divide-by-N frequency divider.

7. A frequency synthesizer of a mobile unit for a time division multiple access (TMDA) cellular communication system, said system having a plurality of cell sites each being assigned a channel of unique frequency for carrying a TDMA frame having a sequence of receive and transmit slots and at least one idle slot, comprising:

a reference pulse source for generating a train of reference pulses;

a phase comparator for generating a phase difference signal indicative of the phase difference between two input signals applied thereto;

a loop filter connected to the phase comparator to develop a voltage corresponding to said phase difference signal;

a voltage-controlled oscillator connected to the loom filter for generating an output signal at a frequency corresponding to the voltage developed by the loop filter;

a frequency divider connected to said voltage-controlled oscillator for producing an output pulse at a frequency which is a submultiple of the frequency of the output from the voltage-controlled oscillator;

a phase alignment circuit for establishing initial phase alignment between an output pulse from said frequency divider and a reference pulse from said reference pulse source in response to an enable signal applied thereto and applying the phase-aligned signals to said phase comparator as said two input signal;

a delay circuit for delaying the output of said frequency divider for a predetermined interval;

a phase-lock detector connected to the phase comparator for producing a phase-lock detecting signal when said phase difference indicates that said two input signals are locked in phase;

switching means for exclusively connecting the reference pulse of said reference pulse source to said phase alignment circuit in response to a first mode signal applied thereto and exclusively connecting the output of the delay circuit to said phase alignment circuit in response to a second mode signal applied thereto;

control means for generating said first mode signal, said enable signal and a channel selection signal during the idle slot of a TDMA frame, and generating said second mode signal during said receive and transmit slots of the TDMA frame, and switching said reference pulse source into an inactive state during said receive and transmit slots and into an active state during said idle slot of the TDMA frame, said control means applying said channel selection signal to said reference pulse source so that the output of said voltage-controlled oscillator is varied according to the channel selection signal and responding to a first phase-lock detect signal generated by said phase-lock detector in the presence of said first mode signal for determining a transition from said first mode signal to said second mode signal and responding to a second phase-lock detect signal generated by said phase-lock detector in the present of said second mode signal for determining a transition from the active state of the reference pulse source to the inactive stage thereof;

first and second D flip-flops each having a data input port connected to receive said reference pulse and a clock input port, the clock input of the first D flip-flop being responsive to the output of said voltage-controlled oscillator and the clock input of the second D flip-flop being responsive to the enable signal from said control means, said second D flip-flop producing an output for enabling said frequency divider to produce an output thereof; and first and second coincidence gates each having first and second input ports, the first input ports of said first and second coincidence gates being connected to be responsive to the enable signal from said control means, the second input port of the first coincidence gate being connected to be responsive to an output of said first D flip-flop for generating one of the input signals of said phase comparator, and the second input port of the second coincidence gate being connected to be responsive to the output of said frequency divider for generating the other input signal of said phase comparator.

8. A mobile unit for a time division multiple access (TDMA) cellular communication system, said system having a plurality of cell sites each being assigned a channel of unique frequency for carrying a TDMA frame having a sequence of receive and transmit slots and at least one idle slot, comprising:

a transceiver for establishing a communication with one of said cell sites on assigned receive and transmit slots of the TDMA frame;

a reference pulse source for generating a train of reference pulses;

a phase comparator for generating a phase difference signal indicative of the phase difference between two input signals applied thereto;

a switched filter bank comprising a plurality of loop filters and means for selecting one of the loop filters in response to a channel selection signal, each of said loop filters having a unique cutoff frequency;

means for establishing a connection between the output of said phase comparator and said switched filter bank in response to a close-loop command signal to cause a voltage to be developed in the selected loop filter according to said phase difference signal and clearing said connection in response to an open-loop command signal;

a voltage-controlled oscillator connected to the selected loop filter for generating an output signal at a frequency corresponding to the voltage developed by the selected loop filter as a local carrier of said transceiver;

a frequency divider connected to said voltage-controlled oscillator for producing an output at a frequency which is a submultiple of the frequency of the output from the voltage-controlled oscillator;

a phase alignment circuit for establishing initial phase alignment between an output pulse from said frequency divider and a reference pulse from said reference pulse source in response to an enable signal applied thereto and applying the phase-aligned signals to said phase comparator as said two input signals;

control means for causing the mobile unit to scan a different one of the plurality of cell sites during each of a plurality of idle slots and to return to a receive or transmit frequency during the respective receive and transmit slots by providing a series of channel selection signals which alternately select between one of the plurality of loop filters during an idle slot and a loop filter which corresponds to the receive or transmit frequency during the respective receive and transmit slots so that a different one of the plurality of loop filters is selected for each of a plurality of successive idle slots by generating said open-loop command signal during said receive and transmit slots of the TDMA frame, and generating said close-loop command signal, said enable and said channel selection signal during the idle slot of the TDMA frame to cause a receive section of the transceiver to be momentarily tuned to the TDMA frame of an adjacent cell site, and deactivating said reference pulse source during said receive and transmit slots and activating said reference pulse source during said idle slot of the TDMA frame; and a power saving circuit for deactivating a transmit section of the transceiver and activating the receive section of the transceiver at periodic intervals when said mobile unit is in a standby mode, and activating said transmit section during the assigned transmit slot and activating said receive section during the assigned transmit slot and said idle slot when said mobile unit is in a talking mode.

9. A frequency synthesizer of a mobile unit for a time division multiple access (TDMA) cellular communication system, said system having a plurality of cell sites each being assigned a channel of unique frequency for carrying a TDMA frame having a sequence of receive and transmit slots and at least one idle slot, comprising:

a transceiver for establishing communication with one of said cell sites on assigned receive and transmit slots of the TDMA frame;

a reference pulse source for generating a train of reference pulses;

a phase comparator for generating a phase difference signal indicative of the phase difference between two input signals applied thereto;

a loop filter;

means for establishing a connection between the output of said phase comparator and said loop filter in response to a close-loop command signal to cause the selected loop filter to develop a voltage according to said phase difference signal and clearing said connection in response to an open-loop command signal;

a voltage-controlled oscillator connected to the loop filter for generating an output signal at a frequency corresponding to the voltage developed by the loop filter;

a frequency divider connected to said voltage-controlled oscillator for producing an output pulse at a frequency which is a submultiple of the frequency of the output from the voltage-controlled oscillator;

a phase alignment circuit for establishing initial phase alignment between an output pulse from said frequency divider and a reference pulse from said reference pulse source in response to an enable signal applied thereto and applying the phase-aligned signals to said phase comparator as said two input signals;

a phase-lock detector connected to the phase comparator for producing a phase-lock detecting signal when said phase difference indicates that said two input signals are locked in phase;

means for generating a steady-state detect signal indicating that the voltage developed in said loop filter has attained a substantially steady value;

gate means for generating a signal indicating that said phase-lock detect signal and said steady-state detect signal are simultaneously present;

control means for causing the mobile unit to scan a different one of the plurality of cell sites during each of a plurality of idle slots and to return to a receive or transmit frequency during the respective receive and transmit slots by generating said open-loop command signal during said receive and transmit slots of the TDMA frame, and generating said close-loop command signal and said enable signal and a channel selection signal during the idle slot of the TDMA frame, and deactivating said reference pulse source during said receive and transmit slots and activating said reference pulse source during said idle slot of the TDMA frame, and applying said channel selection signal to one of said reference pulse source and said frequency divider so that the output of said voltage-controlled oscillator is varied according to the channel selection signal to cause a receive station of said transceiver to by momentarily tuned to the TDMA frame of an adjacent cell site, and responding to the signal from said gate means after said channel selection signal is generated for determining a transition from said close-loop command signal to said open-loop command signal; and a power saving circuit for deactivating a transmit section of the transceiver and activating the receive section of the transceiver at periodic intervals when said mobile unit is in a standby mode, and activating said transmit section during the assigned transmit slot and activating said receive section during the assigned transmit slot and said idle slot when said mobile unit is in a talking mode.

10. A frequency synthesizer of a mobile unit for a time division multiple access (TDMA) cellular communication system, said system having a plurality of cell sites each being assigned a channel of unique frequency for carrying a TDMA frame having a sequence of receive and transmit slots and at least one idle slot, comprising:

a transceiver for establishing communication with one of said cell sites on assigned receive and transmit slots of the TDMA frame;

a reference pulse source for generating a train of reference pulses;

a phase comparator for generating a phase difference signal indicative of the phase difference between two input signals applied thereto;

a loop filter connected to the phase comparator to develop a voltage corresponding to said phase difference signal;

a voltage-controlled oscillator connected to the loop filter for generating an output signal at a frequency corresponding to the voltage developed by the loop filter;

a frequency divider connected to said voltage-controlled oscillator for producing an output pulse at a frequency which is a submultiple of the frequency of the output from the voltage-controlled oscillator;

a phase alignment circuit for establishing initial phase alignment between an output pulse from said frequency divider and a reference pulse from said reference pulse source in response to an enable signal applied thereto and applying the phase-aligned signals to said phase comparator as said two input signals;

a delay circuit for delaying the output of said frequency divider for a predetermined interval;

a phase-lock detector connected to the phase comparator for producing a phase-lock detecting signal when said phase difference indicates that said two input signals are locked in phase;

switch means for exclusively connecting the reference pulse of said reference pulse source to said phase alignment circuit in response to a first mode signal applied thereto and exclusively connecting the output of the delay circuit to said phase alignment circuit in response to a second mode signal applied thereto; and control means for causing the mobile unit to scan a different one of the plurality of cell sites during each of a plurality of idle slots and to return to a receive or transmit frequency during the respective receive and transmit slots by generating said first mode signal, said enable signal and a channel selection signal during the idle slot of a TDMA frame, and generating said second mode signal during said receive and transmit slots of the TDMA frame, and switching said reference pulse source into an inactive state during said receive and transmit slots and into an active state during said idle slot of the TDMA frame, and applying said channel selection signal to said reference pulse source so that the output of said voltage-controlled oscillator is varied according to the channel selection signal and responding to a first phase-lock detect signal generated by said phase-lock detector in the presence of said first mode signal for determining a transition from said first mode signal to said second mode signal and responding to a second phase-lock detect signal generated by said phase-lock detector in the present of said second mode signal for determining a transition from the active state of the reference pulse source to the inactive stage thereof; and a power saving circuit for deactivating a transmit section of the transceiver and activating the receive section of the transceiver at periodic intervals when said mobile unit is in a standby mode, and activating said transmit section during the assigned transmit slot and activating said receive section during the assigned transmit slot and said idle slot when said mobile unit is in a talking mode.

11. In a frequency synthesizer of a mobile unit for a time division multiple access (TDMA) cellular communication system, said system having a plurality of cell site stations each being assigned a channel of unique frequency for carrying a TDMA frame having transmit/receive slots and idle slots, the synthesizer comprising a reference pulse source, a phase comparator, a loop filter, a voltage-controlled oscillator connected to the loop filter, switch means for establishing and clearing a connection between the phase comparator and the loop filter, and a variable frequency divider connected to the voltage-controlled oscillator for producing an output at a submultiple of an output frequency of the voltage-controlled oscillator, said phase comparator being responsive to a reference pulse from the reference pulse source and the output of the variable frequency divider for supplying a phase difference signal to the loop filter, a power saving method comprising the steps of:

a) activating said reference pulse source and operating said switch means to establish said connection;

b) operating the frequency divider at a first submultiple of the output frequency of said voltage-controlled oscillator so that a channel is established between the mobile unit and a first cell site station;

c) operating said switch means to clear said connection and deactivating said reference pulse source, and allowing signal to be exchanged between the mobile unit and said first cell site station on a transmit/receive slot of said channel;

d) activating said reference pulse source, operating said switch means to establish said connection and operating the frequency divider at a second submultiple of the output frequency of the voltage-controlled oscillator so that the mobile unit can receive a signal from a second cell site station;

e) receiving a signal from said second cell site station during an idle slot of the channel and detecting power level of the received signal; and f) repeating the steps (b) to (e).

12. In a frequency synthesizer of a mobile unit for a time division multiple access (TDMA) cellular communication system, said system having a plurality of cell sites each being assigned a channel of unique frequency for carrying a TDMA frame having transmit/receive slots and idle slots, the frequency synthesizer comprising:

a reference pulse source for generating a reference pulse;

a phase comparator having a first input terminal responsive to said reference pulse, a second input terminal and an output terminal;

a loop filter;

switch means for establishing a connection between the output terminal of said phase comparator and said loop filter;

a voltage-controlled oscillator connected to the loop filter for generating an output signal at a frequency corresponding to a voltage developed by the loop filter;

a frequency divider connected to said voltage-controlled oscillator for supplying an output pulse at a submultiple of an output frequency of the voltage-controlled oscillator to the second input terminal of the phase comparator;

a phase-lock detector connected to the phase comparator for producing a phase-lock detect signal when said phase difference indicates that signals at the first and second input terminals of the phase comparator are locked in phase;

means for generating a steady-state detect signal indicating that a voltage developed in said loop filter has attained a substantially steady value; and gate means for generating an output indicating that said phase-lock detect signal and said steady-state detect signal are simultaneously present, a power saving method comprising the steps of:
a) activating said reference pulse source and operating said switch means to establish said connection,
b) operating the frequency divider at a first submultiple of the output frequency of said voltage-controlled oscillator so that a channel is established between the mobile unit and a first cell site station;
c) operating said switch means to clear said connection in response to, the output of said gate means, and deactivating said reference source, and allowing signals to be exchanged between the mobile unit and said first cell site station on a transmit/receive slot of said channel;
d) activating said reference pulse source, operating said switch means to establish said connection and operating the frequency divider at a second submultiple of the output frequency of the voltage-controlled oscillator so that the mobile unit can receive a signal from a second cell site station;
e) receiving a signal from said cell site station during an idle slot of the channel and detecting power level of the received signal; and
f) repeating the steps (b) to (e).

13. In a frequency synthesizer of a mobile unit for a time division multiple access (TDMA) cellular communication system, said system having a plurality of cell sites each being assigned a channel of unique frequency for carrying a TDMA frame having transmit/receive slots and idle slots, the frequency synthesizer comprising:

a reference pulse source for generating a reference pulse;
a phase comparator having first and second input terminals and an output terminal;
a loop filter connected to the output terminal of the phase comparator;
a voltage-controlled oscillator connected to the loop filter;
a frequency divider connected to said voltage-controlled oscillator for supplying an output pulse at a submultiple of an output frequency of the voltage-controlled oscillator to the first input terminal of the phase comparator;
a delay circuit for delaying the output of said frequency divider for a predetermined interval; and
a phase-lock detector connected to the phase comparator for producing a phase-lock detect signal when said phase difference indicates that signals at the first and second input terminals of the phase comparator are locked in phase; and switch means for applying the reference pulse from said reference pulse source or an output signal of the delay means to the second input terminal of the phase comparator, a power saving method comprising the steps of:
a) activating said reference pulse source,
b) operating said switch means to apply the reference pulse to the second input terminal of the phase comparator, and operating the frequency divider at a first submultiple of the output frequency of said voltage-controlled oscillator so that a channel is established between the mobile unit and a first cell site station;
c) operating said switch means to apply the output signal of the delay means to the second input terminal of the phase comparator in response to said phase-lock detect signal, deactivating said reference pulse source, and allowing signals to be exchanged between the mobile unit and said first cell site station on a transmit/receive slot of the channel;
d) activating said reference pulse source, operating said switch means to apply the reference pulse to the second input terminal of the phase comparator, and operating the frequency divider at a second submultiple of the output frequency of said voltage-controlled oscillator so that the mobile unit can receive a signal from a second cell site station;
e) receiving a signal from said second cell site station during an idle slot of the channel and detecting poser level of the received signal; and
f) repeating the steps (b) to (e).

14. A frequency synthesizer as claimed in claim 1, wherein said phase alignment comprises:

first and second D flip-flops each having a data input port connected to receive said reference pulse and a clock input port, the clock input of the first D flip-flop being responsive to the output of said voltage-controlled oscillator and the clock input of the second D flip-flop being responsive to the enable signal from said control means, said second D flip-flop producing an output for enabling said frequency divider to produce an output thereof; and first and second coincidence gates each having first and second input ports, the first input ports of said first and second coincidence gates being connected to be responsive to the enable signal from said control means, the second input port of the first coincidence gate being connected to be responsive to an output of said first D flip-flop for generating one of the input signals of said phase comparator, and the second input port of the second coincidence gate being connected to be responsive to the output of said frequency divider for generating the other input signal of said phase comparator.

15. A frequency synthesizer of a mobile unit for a time division multiple access (TDMA) cellular communication system, said system having a plurality of cell sites each being assigned a channel of unique frequency for carrying a TDMA frame having a sequence of receive and transmit slots and at least one idle slot, comprising:

a reference pulse source for generating a train of reference pulses;
a phase comparator for generating a phase difference signal indicative of the phase difference between two input signals applied thereto;
at least one loop filter;
means for establishing a connection between the output of said phase comparator and said loop filter in response to a close-loop command signal to cause the selected loop filter to develop a voltage according to said phase difference signal and clearing said connection in response to an open-loop command signal;
a voltage-controlled oscillator connected to the loop filter for generating an output signal at a frequency corresponding to the voltage developed by the loop filter;
a frequency divider connected to said voltage-controlled oscillator for producing an output pulse at a frequency which is a submultiple of the frequency of the output from the voltage-controlled oscillator;
a phase alignment circuit for establishing initial phase alignment between an output pulse from said frequency divider and a reference pulse from said reference pulse source in response to an enable signal applied thereto and applying the phase-aligned signals to said phase comparator as said two input signals;

control means for causing the mobile unit to scan a different one of the plurality of cell sites during each of a plurality of idle slots and to return to a receive or transmit frequency during the respective receive and transmit slots by generating said open-loop command signal during said receive and transmit slots of the TDMA frame, and generating said close-loop command signal and said enable signal and a channel selection signal during the idle slot of the TDMA frame, and applying said channel selection signal to said at least one loop filter, said reference pulse source and said frequency divider so that the output of said voltage-controlled oscillator is varied according to the channel selection signal and for deactivating said reference pulse source during said receive and transmit slots and activating said reference pulse source during said idle slot of the TDMA frame.

* * * * *

UNITED STATES PATENT AND TRADEMARK OFFICE
CERTIFICATE OF CORRECTION

PATENT NO.    : 5,541,929
DATED         : July 30, 1996
INVENTOR(S)   : June JOKURA It is certified that error(s) appears in the above-identified patent and that said Letters Patent is hereby corrected as shown below:

Column 2, line 46, delete "vaned" and insert --varied--.

Column 4, line 1, delete "rams" and insert --turns--.

Column 5, line 19, delete "tint" and insert --first--.

Column 5, line 43, delete "421 and capacitor 431" and insert --42, and capacitor $43_1$--.

Column 5, line 60, delete "154" and insert --64--.

Column 6, line 22, after "capacitor" insert --$43_1$--.

Column 6, line 23, delete "to" and insert --$t_o$--.

Column 6, line 57, delete "234" and insert --23--.

Column 8, line 21, delete "1221" and insert --$122_1$--.

Signed and Sealed this

Third Day of December, 1996

Attest:

Attesting Officer

BRUCE LEHMAN

Commissioner of Patents and Trademarks